United States Patent
Lee et al.

(10) Patent No.: US 10,971,838 B1
(45) Date of Patent: Apr. 6, 2021

(54) COMBINATION STRUCTURE OF CLAMPING MEMBER AND CIRCUIT BOARD FOR SIGNAL CONNECTOR

(71) Applicants: Chun-Te Lee, Taichung (TW); Yi-Ju Lee, Taichung (TW)

(72) Inventors: Chun-Te Lee, Taichung (TW); Yi-Ju Lee, Taichung (TW)

( * ) Notice: Subject to any disclaimer, the term of this patent is extended or adjusted under 35 U.S.C. 154(b) by 0 days.

(21) Appl. No.: 16/684,580

(22) Filed: Nov. 14, 2019

(51) Int. Cl.
| | |
|---|---|
| *H01R 12/71* | (2011.01) |
| *H01R 12/58* | (2011.01) |
| *H01R 4/02* | (2006.01) |
| *H05K 1/18* | (2006.01) |
| *H01R 31/06* | (2006.01) |

(52) U.S. Cl.
CPC .......... *H01R 12/718* (2013.01); *H01R 4/027* (2013.01); *H01R 12/58* (2013.01); *H01R 31/065* (2013.01); *H05K 1/18* (2013.01); *H05K 2201/1053* (2013.01); *H05K 2201/10295* (2013.01); *H05K 2201/10386* (2013.01); *H05K 2201/10606* (2013.01)

(58) Field of Classification Search
CPC .............. H01R 2103/00; H01R 24/542; H01R 13/111; H01R 9/0503; H01R 13/622; H01R 24/40; H01R 24/44; H01R 31/06; H01R 4/4818; H01R 11/07; H01R 13/11; H01R 13/113; H01R 13/115; H01R 13/15; H01R 13/187; H01R 2201/18; H01R 2201/26; H01R 24/545; H01R 43/16; H01R 4/48; H01R 4/60; H01R 9/0521; H01R 12/718; H05K 1/18; H05K 1/181; H05K 1/182; H05K 1/183; H05K 2201/09036; H05K 2201/09063; H05K 2201/10; H05K 2201/10098; H05K 2201/10189; H05K 2201/10295; H05K 2201/10303; H05K 2201/1031; H05K 2201/10318; H05K 2201/10325; H05K 2201/10333; H05K 2201/10386; H05K 2201/10492; H05K 2201/1053; H05K 2201/10545; H05K 2201/10606
See application file for complete search history.

(56) References Cited

U.S. PATENT DOCUMENTS

| | | | | |
|---|---|---|---|---|
| 5,863,226 | A * | 1/1999 | Lan ....................... | H01R 9/0503 439/578 |
| 5,865,654 | A * | 2/1999 | Shimirak ............... | H01R 13/11 439/578 |
| 6,250,960 | B1 * | 6/2001 | Youtsey ............... | H01R 9/0503 439/578 |
| 6,276,970 | B1 * | 8/2001 | Wong ................... | H01R 24/542 439/578 |
| 6,398,593 | B1 * | 6/2002 | Yeh ........................ | H01R 31/06 439/654 |

(Continued)

*Primary Examiner* — Edwin A. Leon
*Assistant Examiner* — Matthew T Dzierzynski
(74) *Attorney, Agent, or Firm* — Bruce Stone LLP; Joseph A. Bruce (57) ABSTRACT

A combination structure of a clamping member and a circuit board for a signal connector is disclosed. The clamping member includes two clamping members fixedly connected to two sides of the circuit board. Each clamping member has a pair of first positioning pins and a pair of second positioning pins. Thereby, the center of the guide pin can be guided and the guide pin won't be loosened, so as to improve the stability of the signal and reduce the loss.

8 Claims, 8 Drawing Sheets

(56) References Cited

U.S. PATENT DOCUMENTS

| | | | | |
|---|---|---|---|---|
| 6,595,799 B2 * | 7/2003 | Yao | ............... | H01R 24/44 |
| | | | | 439/578 |
| 6,808,426 B2 * | 10/2004 | Liu | ............... | H01R 24/542 |
| | | | | 439/578 |
| 6,899,563 B1 * | 5/2005 | Lee | ............... | H01R 24/40 |
| | | | | 439/578 |
| 7,113,061 B2 * | 9/2006 | Ootori | ............... | H04B 1/08 |
| | | | | 334/85 |
| 7,500,855 B2 * | 3/2009 | Kari | ............... | H01R 24/50 |
| | | | | 439/63 |
| 7,527,501 B2 * | 5/2009 | Kuroda | ............... | H01P 5/085 |
| | | | | 439/581 |
| 8,083,544 B2 * | 12/2011 | Chee | ............... | H01R 24/542 |
| | | | | 439/578 |
| 8,298,020 B1 * | 10/2012 | Chen | ............... | H01R 4/4818 |
| | | | | 439/852 |
| 8,702,456 B1 * | 4/2014 | Wang | ............... | H01R 13/111 |
| | | | | 439/851 |
| 8,888,527 B2 * | 11/2014 | Chastain | ............... | H01R 24/545 |
| | | | | 439/578 |
| 9,271,391 B2 * | 2/2016 | Okayama | ............... | H05K 3/32 |
| 9,431,728 B2 * | 8/2016 | Shaw | ............... | H01R 31/06 |
| 9,433,083 B2 * | 8/2016 | Moncayo | ............... | H01R 24/50 |
| 9,799,969 B2 * | 10/2017 | Lee | ............... | H01R 4/60 |
| 10,148,027 B2 * | 12/2018 | Matsumoto | ............... | H05K 1/0242 |
| 2008/0176439 A1 * | 7/2008 | Chen | ............... | H05K 1/182 |
| | | | | 439/345 |

* cited by examiner

COMBINATION STRUCTURE OF CLAMPING MEMBER AND CIRCUIT BOARD FOR SIGNAL CONNECTOR

FIELD OF THE INVENTION

The present invention relates to a clamping member of a signal connector, and more particularly to a combination structure of a clamping member and a circuit board for a signal connector.

BACKGROUND OF THE INVENTION

The clamping member of a conventional signal connector is made of a metal conductive material, including a connecting plate and two clamping heads. The clamping heads are disposed on two side ends of the connecting plate, respectively. Each clamping head is composed of two longitudinal clamping plates. The clamping plates are obliquely extended from the connecting end of the connecting plate to a distance and then intersected to form a clamping portion that is flared for guiding a guide pin of a male connector.

However, the conventional connecting heads are fixed to the connecting plate by welding, respectively. When the guide pin is repeatedly inserted and removed, it will cause the clamping heads to shake and deviate from the installation position. As a result, the guide pin is skewed, increasing the loss of the signal passing through the signal connector, reducing the transmission quality, and leasing to a malfunction because the welding position is worn due to the shaking under long-term use. Accordingly, the inventor of the present invention has devoted himself based on his many years of practical experiences to solve these problems.

SUMMARY OF THE INVENTION

The primary object of the present invention is to provide a combination structure of a clamping member and a circuit board for a signal connector, which can guide the center of a guide pin and prevent the guide pin from loosening, thereby improving the stability of the signal and reducing the loss.

In order to achieve the aforesaid object, a combination structure of a clamping member and a circuit board for a signal connector is provided. The circuit board defines an axis. Either end of the circuit board is formed with a positioning groove extending in the direction of the axis. The circuit board is formed with a positioning hole that is located close to and spaced from the positioning groove. The clamping member includes two clamping plates, a bottom plate, and a positioning plate. The clamping plates are connected to the bottom plate. The positioning plate is connected to the bottom plate. The positioning plate is provided with a pair of first positioning pins and a pair of second positioning pins. The first positioning pins are positioned to the positioning hole. The second positioning pins are positioned to the positioning groove.

In the combination structure of the clamping member and the circuit board provided by the present invention, the clamping member has the function of guiding the center of the guide pin so that the guide pin is not skewed. The guide pin won't be loosened through the good elastic clamping force exerted by the arched arm, improving the stability of the signal and reducing the loss.

DETAILED DESCRIPTION OF THE PREFERRED EMBODIMENTS

Embodiments of the present invention will now be described, by way of example only, with reference to the accompanying drawings.

Figure 1:
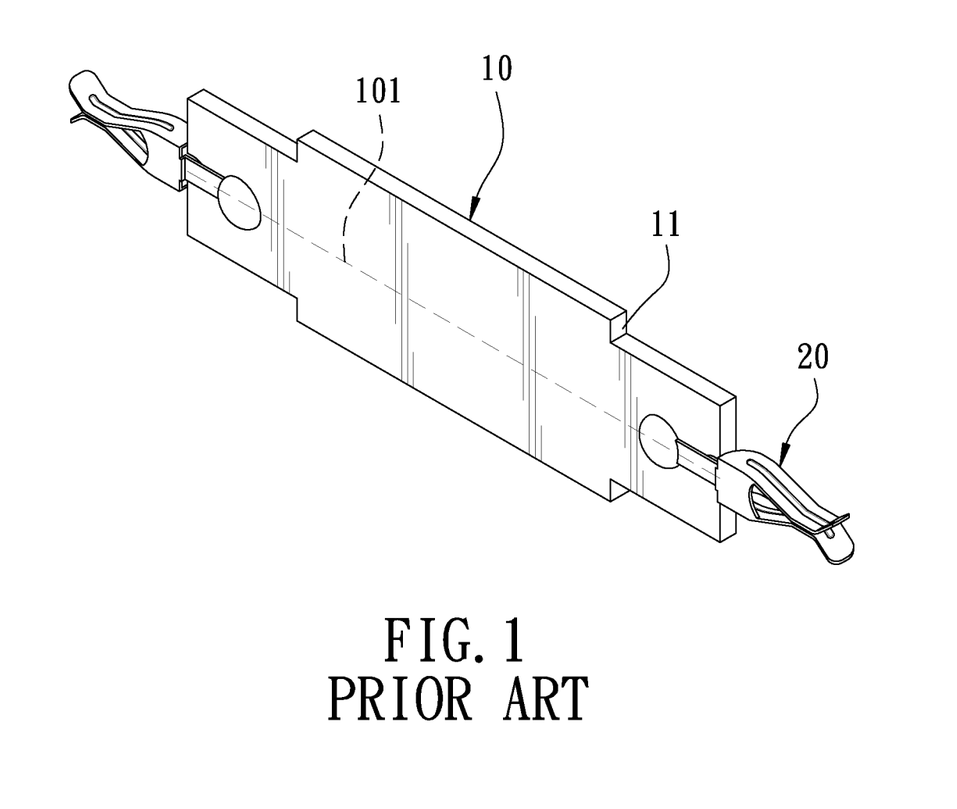
FIG. 1 is a perspective view in accordance with a first embodiment of the present invention.
Figure 2:
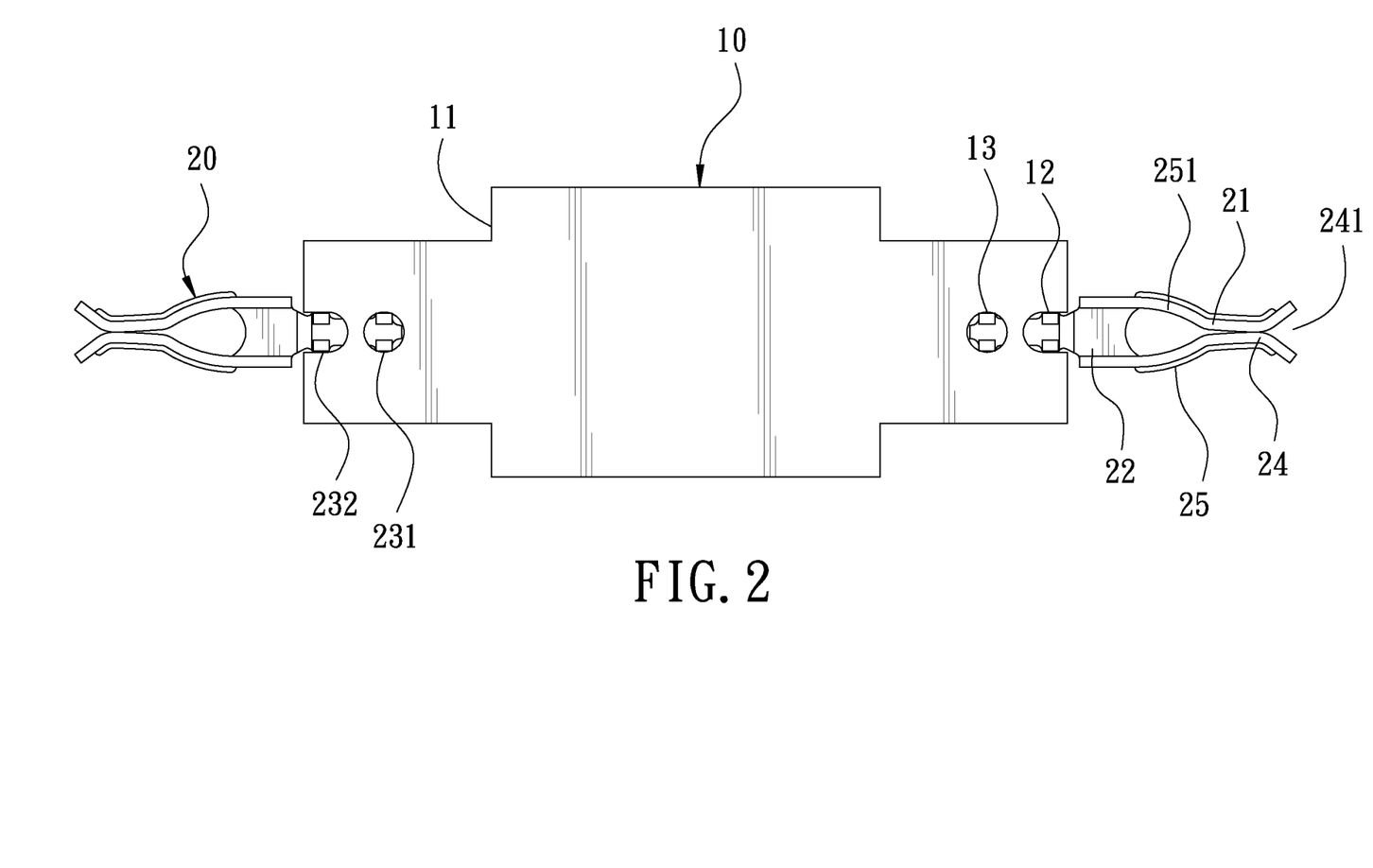
FIG. 2 is a top view in accordance with the first embodiment of the present invention.
Figure 3:
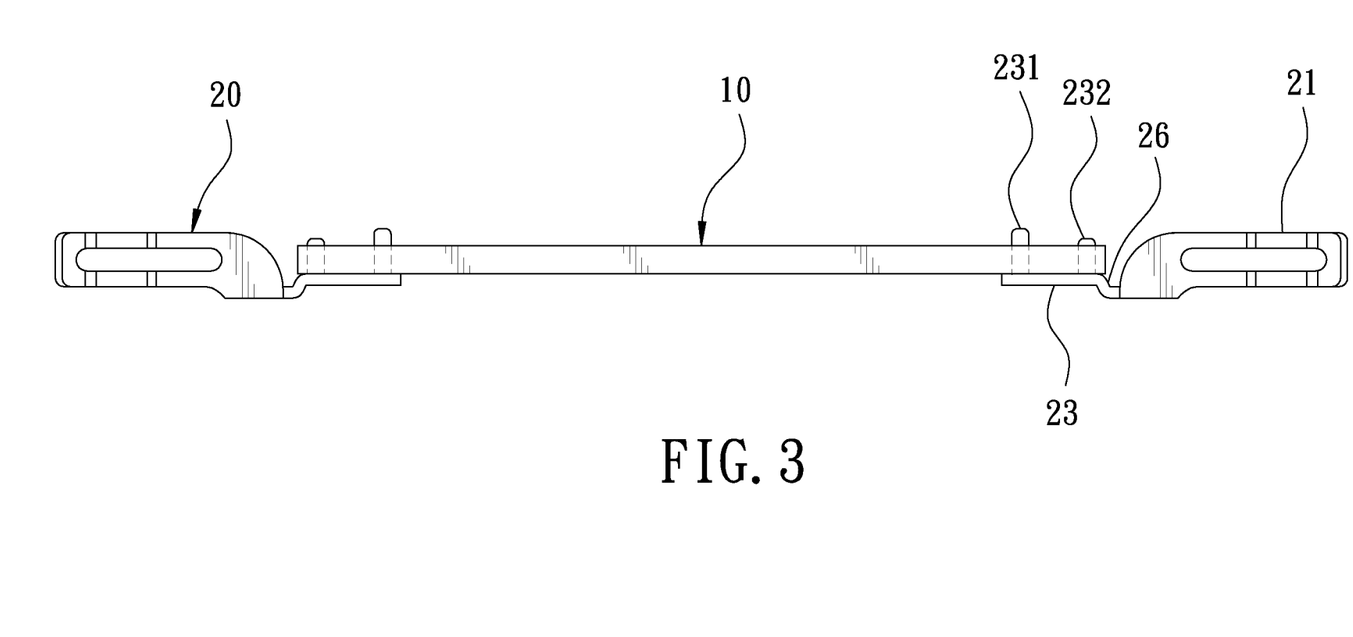
FIG. 3 is a side view in accordance with the first embodiment of the present invention.

FIG. 1 is a perspective view in accordance with a first embodiment of the present invention. FIG. 2 is a top view in accordance with the first embodiment of the present invention. FIG. 3 is a side view in accordance with the first embodiment of the present invention. The invention discloses a combination structure of a clamping member and a circuit board for a signal connector, comprising a circuit board 10 and two clamping members 20.

The circuit board 10 is generally rectangular in shape. Four corners of the circuit board 10 are formed with four rectangular notches 11. The circuit board 10 defines an axis 101. Either end of the circuit board 10 is formed with a positioning groove 12 extending in the direction of the axis 101. The positioning groove 12 may be a U-shaped groove or a rectangular groove. In this embodiment of the present invention, the positioning groove 12 is a U-shaped groove. The circuit board 10 is formed with a positioning hole 13 that is located close to and spaced from the positioning groove 12. The positioning hole 13 may be a circular hole, an elliptical hole or a polygonal hole. In this embodiment of the present invention, the positioning hole 13 is a circular hole. The center of the positioning groove 12 and the center of the positioning hole 13 are located on the axis 101.

The two clamping members 20 are fixedly connected to two ends of the circuit board 10, respectively. Each clamping member 20 includes two longitudinal clamping plates 21, a bottom plate 22, and a positioning plate 23. In this embodiment of the present invention, the clamping plates 21, the bottom plate 22 and the positioning plate 23 are integrally formed. Respective two ends of the clamping plates 21 are defined as a first end 24 and a second end 25. The first ends 24 of the clamping plates 21 are flared to form a flared opening 241, which facilitates insertion of a guide pin. The second ends 25 of the clamping plates 21 are connected to the bottom plate 22. The second ends 25 of the clamping plates 21 respectively expand and extend outwardly by a distance to form an arched arm 251. The positioning plate 23 is connected to the bottom plate 22 and close to the second ends 25 of the clamping plates 21. A connecting plate 26 is connected between the positioning plate 23 and the bottom plate 22. In this embodiment of the present invention, the connecting plate 26 is inclined upwardly from the bottom plate 22 towards the positioning plate 23. Therefore, the vertical height of the positioning plate 23 is greater than the vertical height of the bottom plate 22, so that when the guide pin is inserted, it can be positioned at a position aligned with the axis 10 of the circuit board 10, thereby achieving the coaxial effect. The positioning plate 23 is provided with a pair of first positioning pins 231. The first positioning pins 231 are positioned to the positioning hole 13. The positioning plate 23 is provided with a pair of second positioning pins 232. The second positioning pins 232 are engaged and fixed to the positioning groove 12. The first positioning pins 231 and the second positioning pins 232 each may have a polygonal, circular or curved cross-section. The length of the first positioning pin 231 is greater than the length of the second positioning pin 232 to facilitate welding, so that the clamping member 20 can be fixed to the circuit board 10. Each clamping member 20 may be fitted with an insulating sleeve 27. The insulating sleeve 27 is substantially trumpet shaped.

Figure 4:
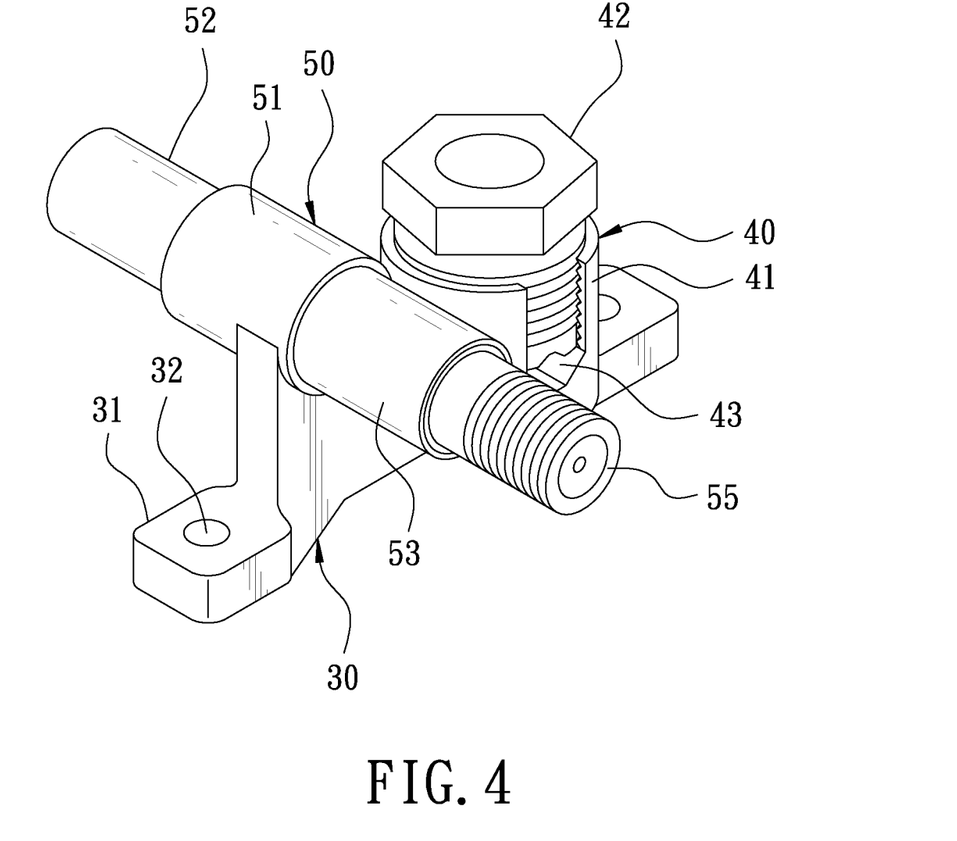
FIG. 4 is a schematic view in accordance with the first embodiment of the present invention when in use.
Figure 5:
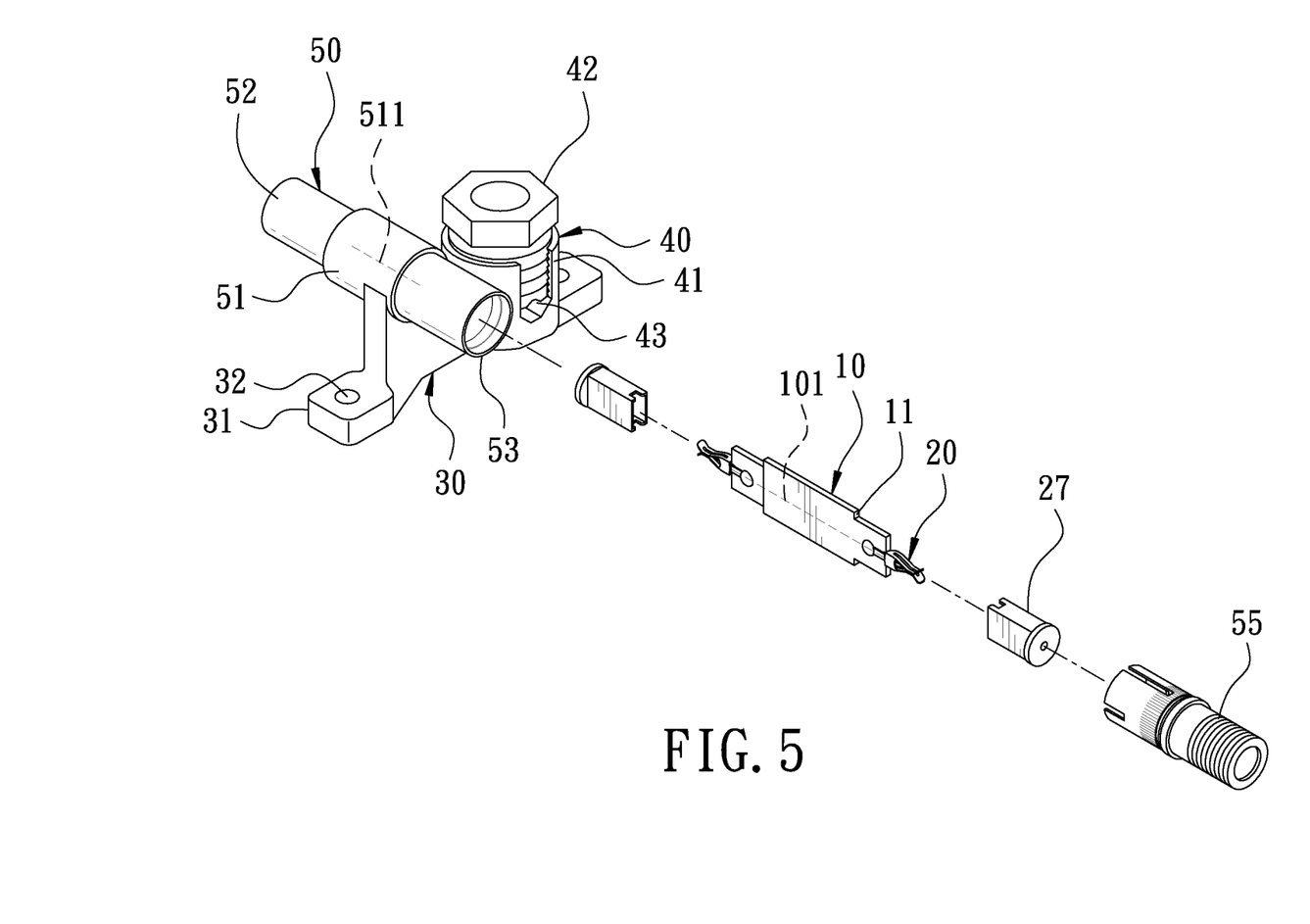
FIG. 5 is an exploded view of FIG. 4.
Figure 6:
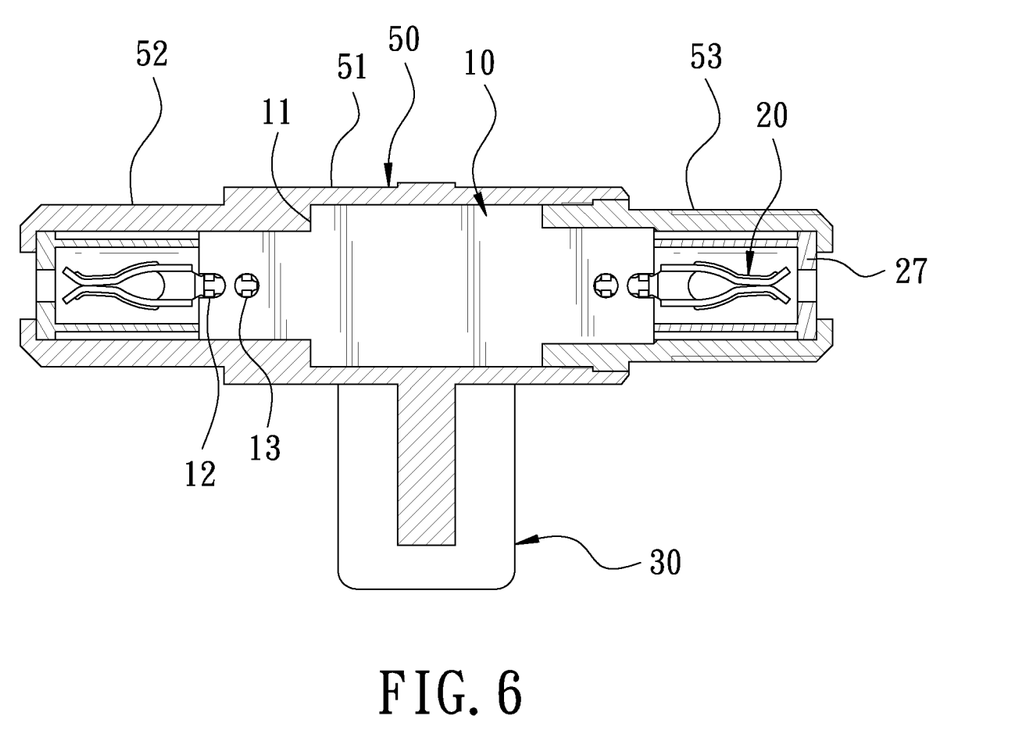
FIG. 6 is a cross-sectional view of FIG. 4.

Referring to FIGS. 4-6, the present invention is used in conjunction with a connector. The connector includes a base 30, a grounding device 40, and a connecting device 50. Either side of the base 30 extends outwardly to form a retaining leg 31. The retaining leg 31 is provided with a substantially circular through hole 32, so that the base 30 can be fixed at a predetermined position. The grounding device 40 includes a cylindrical screw seat 41 that is formed upwardly from the base 30. The screw seat 41 is screwed with a screw 42. The front and rear sides of the screw seat 41 are formed with U-shaped grooves 43 for laying a grounding wire. The screw 42 is locked to the screw seat 41 for conductive grounding. The connecting device 50 is connected to the base 30. The central portion of the connecting device 50 is a fixed housing 51. The fixed housing 51 defines an axis 511. Two sides of the fixed housing 51 are provided with a first outer connecting portion 52 and a second outer connecting portion 53 that extend outwardly along the axis 511. The first outer connecting portion 52, the second outer connecting portion 53 and the fixed housing 51 collectively define an accommodating room 54 therein. The second outer connecting portion 53 is sleeved with a casing 55. The casing 55 is a hollow casing with openings at two ends thereof, which can be fixed to the connecting device 50.

When the user wants to connect the circuit board 10 to the connector, the first positioning pins 231 are firstly engaged and fixed to the positioning hole 13, and then the second positioning pins 232 are engaged and fixed to the positioning groove 12, so that the clamping members 20 can be positioned simply, quickly and accurately on the axis 101 of the circuit board 10. Finally, the first positioning pins 231 are soldered and fixed to the positioning hole 13 so that the circuit board 10 is combined with the clamping members 20. The insulating sleeves 27 are sleeved onto the clamping members 20, respectively, and then the circuit board 10 is placed into the connecting device 50 along the axis 511 of the fixed housing 51, so that the circuit board 10 is engaged and fixed in the accommodating room 54. At this time, the circuit board 10 is pushed toward the first outer connecting portion 52, and one insulating sleeve 27 is abutted against the first outer connecting portion 52. Finally, the casing 55 is connected to the connecting device 50. Besides, the other insulating sleeve 27 is abutted against the casing 55. The insulating sleeve 27 and the clamping member 20 are accommodated in the casing 55, that is, the assembly of the circuit board 10 and the connector is completed.

It is worth mentioning that when the user inserts a guide pin from the flared opening 241 of the clamping member 20, through the first positioning pins 231, the second positioning pins 232 and the connecting plate 26 of the clamping member 20, the guide pin is positioned on the axis 101 of the circuit board 10 to achieve the coaxial effect. When used, the clamping member 20 and the guide pin are not offset, thereby improving the transmission quality. The guide pin won't be loosened through the good elastic clamping force exerted by the arched arm 251, improving the stability of the signal and reducing the loss.

The length of the first positioning pins 231 is greater than the length of the second positioning pins 232, which facilitates welding. When the clamping member 20 transmits the signal, the signal can be transmitted through the first positioning pins 231, so that the first positioning pins 231 and the circuit board 10 can define a signal channel to improve the transmission quality.

Figure 7:
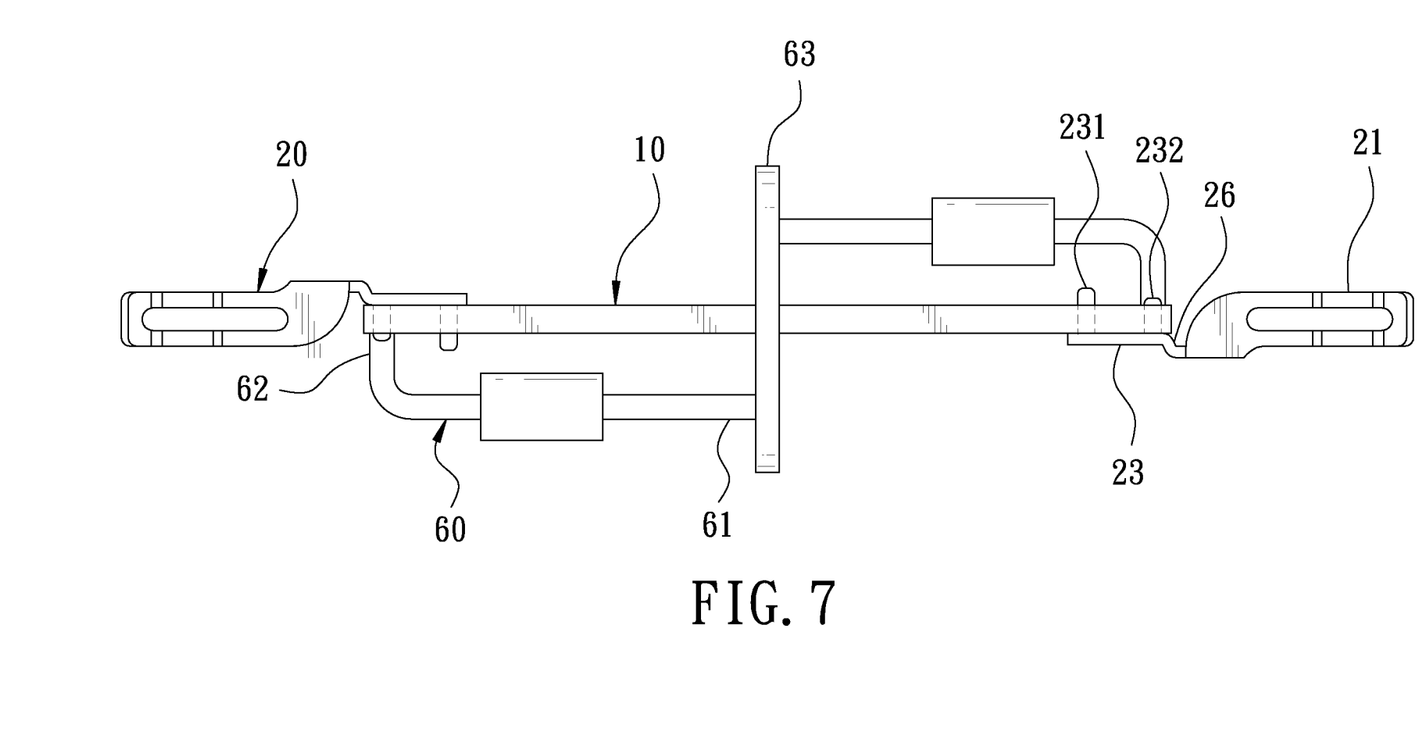
FIG. 7 is a side siew in accordance with a second embodiment of the present invention.
Figure 8:
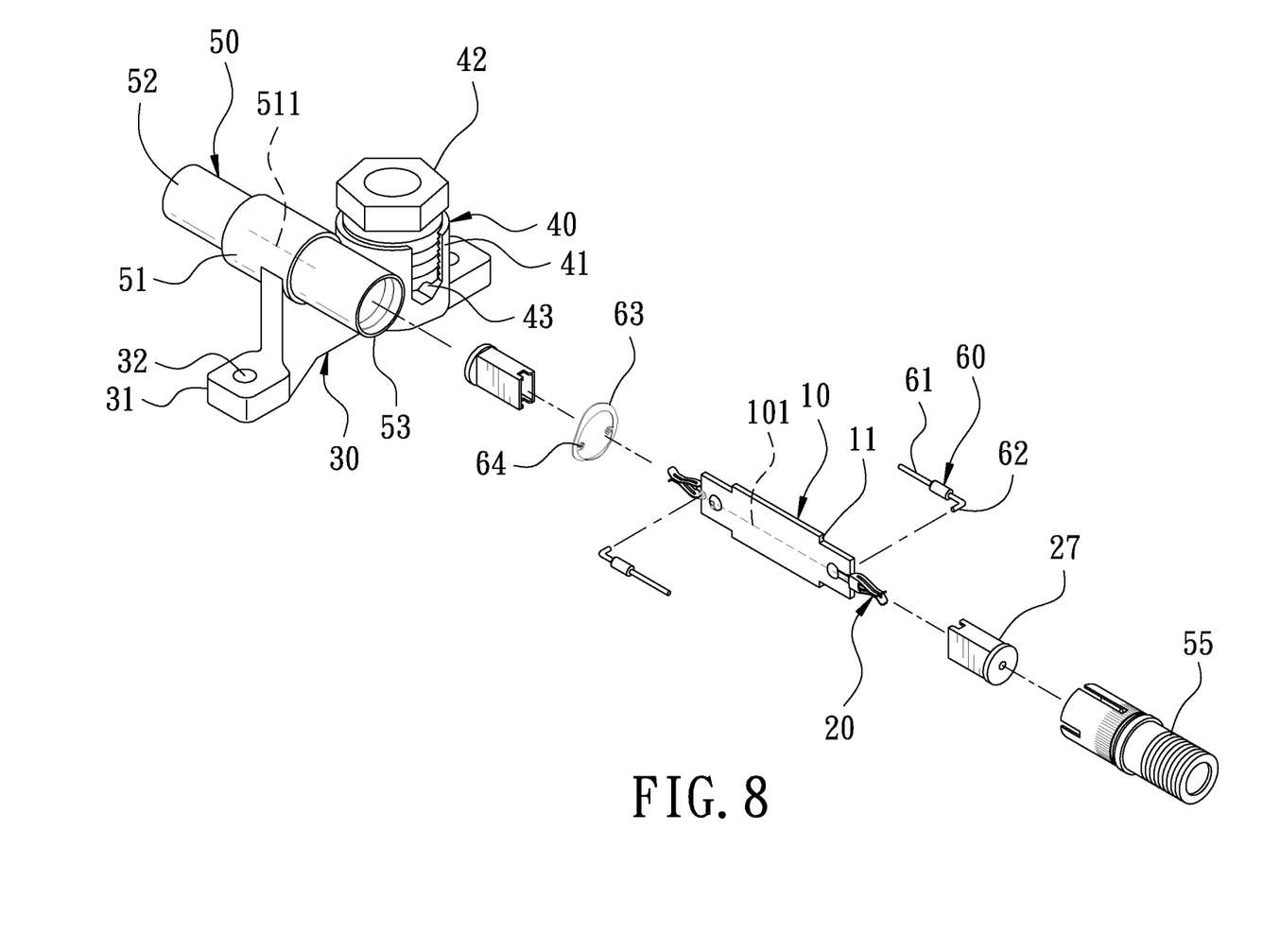
FIG. 8 is a schematic siew in accordance with the second embodiment of the present invention when in use.

FIG. 7 is a side siew in accordance with a second embodiment of the present invention. FIG. 8 is a schematic siew in accordance with the second embodiment of the present invention when in use. The second embodiment is substantially similar to the first embodiment with the exceptions described hereinafter. The clamping members 20 are fixed to the circuit board 10 in opposite directions. A surge-absorbing member 60 is fixedly connected to each of the clamping members 20. The surge-absorbing member 60 has a front end portion 61 and a rear end portion 62 which are oppositely disposed. The front end portion 61 is fixedly connected to a fixing ring 63. The fixing ring 63 is made of metal. The fixing ring 63 has a substantially tapered shape. The fixing ring 63 is formed with two engaging holes 64 at two opposite ends in the fixing ring 63. The front end portion 61 of the surge-absorbing member 60 is soldered to a corresponding one of the engaging holes 64, and the rear end portion 62 is welded and fixed to the second positioning pins 232 of the clamping member 20, so that the surge-absorbing members 60 are located on the two sides of the circuit board 10, respectively. When the circuit board 10 is placed into the connecting device 50, the fixing ring 63 is completely attached to the second outer connecting portion 53 of the connecting device 50, having good conductive grounding. Thereby, the second positioning pins 232, the surge-absorbing member 60 and the fixing ring 63 can define a surge channel. In the normal state, the surge-absorbing member 60 maintains insulation, and the signal passes through the signal channel. When a surge current is encountered, the current passes through the second positioning pins 232, that is, the surge current is electrically grounded from the surge-absorbing member 60 to the connecting device 50 via the retaining ring 63, and the surge current can be completely released to the ground. The surge current does not pass through the first positioning pins 231, thereby preventing damages to the circuit board 10 and the electrical appliances connected to the circuit board 10. In addition, the surge-absorbing members 60 are bidirectionally arranged, so as to bidirectionally prevent the surge current at both ends of the connector.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A combination structure of a clamping member and a circuit board for a signal connector, the circuit board defining an axis, either end of the circuit board being formed with a positioning groove extending in the direction of the axis, the circuit board being formed with a positioning hole that is located close to and spaced from the positioning groove;

the clamping member including two clamping plates, a bottom plate and a positioning plate, the clamping plates being connected to the bottom plate, the positioning plate being connected to the bottom plate, the positioning plate being provided with a pair of first positioning pins and a pair of second positioning pins, the first positioning pins being positioned to the positioning hole, the second positioning pins being positioned to the positioning groove.

2. The combination structure of the clamping member and the circuit board as claimed in claim 1, wherein the positioning groove is a U-shaped groove, the positioning hole is a circular hole, the first positioning pins and the second positioning pins each have a polygonal shape.

3. The combination structure of the clamping member and the circuit board as claimed in claim 1, wherein the first positioning pins each have a length greater than that the second positioning pins.

4. The combination structure of the clamping member and the circuit board as claimed in claim 1, wherein the positioning groove and the positioning hole are located on the axis of the circuit board.

5. The combination structure of the clamping member and the circuit board as claimed in claim 1, wherein the clamping plates, the bottom plate and the positioning plate are integrally formed.

6. The combination structure of the clamping member and the circuit board as claimed in claim 1, wherein a connecting plate is connected between the positioning plate and the bottom plate, and the connecting plate is inclined upwardly from the bottom plate towards the positioning plate.

7. The combination structure of the clamping member and the circuit board as claimed in claim 1, wherein the clamping member includes two clamping members connected to the circuit board in opposite directions.

8. The combination structure of the clamping member and the circuit board as claimed in claim 1, further comprising two surge-absorbing members, each surge-absorbing member having a front end portion and a rear end portion that are oppositely disposed, the front end portion being connected to a fixing ring, the rear end portion being connected to the second positioning pins of the clamping member.

\* \* \* \* \*